United States Patent [19]

Wald

[11] 3,900,844

[45] Aug. 19, 1975

[54] ANALOG AND DIGITAL DATA INTERCONVERSION SYSTEM

[75] Inventor: Leon D. Wald, Minneapolis, Minn.

[73] Assignee: Honeywell Inc., Minneapolis, Minn.

[22] Filed: Oct. 3, 1973

[21] Appl. No.: 402,991

[52] U.S. Cl. .................... 340/347 C; 340/347 AD; 340/347 DA; 177/DIG. 3; 324/99 D

[51] Int. Cl.[2] .................... H03K 13/02

[58] Field of Search .. 340/347 C, 347 DA, 347 AD, 340/347 CC; 324/99 D

[56] References Cited

UNITED STATES PATENTS

| | | | |
|---|---|---|---|
| 2,817,704 | 12/1957 | Huntley | 340/347 C |
| 2,865,564 | 12/1958 | Kaiser et al. | 340/347 C |
| 2,950,348 | 8/1960 | Mayer et al. | 340/347 C |
| 3,403,393 | 9/1968 | Skrenes | 340/347 DA |
| 3,540,037 | 11/1970 | Ottesen | 340/347 C |
| 3,541,544 | 11/1970 | Reuther | 340/347 DA |
| 3,824,588 | 7/1974 | Vermillion | 340/347 CC |

OTHER PUBLICATIONS

Analog Devices, "Analog–Digital Conversion Handbook," 1972, pp. 11–17 thru 11–23.

Hoeschele, "Analog to Digital . . . ," J. Wiley & Sons, 8/1968, pp. 392, 393.

*Primary Examiner*—Thomas J. Sloyan

[57] ABSTRACT

A system for interconverting analog and digital signals in a large number of data channels using supervisory apparatus common to all the channels.

6 Claims, 2 Drawing Figures

ANALOG AND DIGITAL DATA INTERCONVERSION SYSTEM

FIELD OF THE INVENTION

This invention relates to the field of data processing systems, and more particularly to apparatus for interconverting analog and digital signals. The invention is particularly advantageous in environments where a large number of individual channels carrying data must concurrently have the form of their signals converted from digital to analog, or from analog to digital, or both.

DESCRIPTION OF THE PRIOR ART

Provision of a complete interconverter for each channel, while possible, becomes prohibitively expensive when the number of channels is in the hundreds. A known method which time-shares an interconverter among the various channels soon either limits the sampling rate, or requires impracticably fast interconversion, as the number of channels increases.

SUMMARY OF THE INVENTION

The present invention solves the problem by providing supervisory apparatus common to a number of data channels which of themselves include only relatively inexpensive and readily available logic, register, comparator, and gate components. The supervisory apparatus includes a clock, a cycle strobe source, counters, and a bi-polar digital-to-analog converter, and is arranged so that for each cycle of operation of the supervisory apparatus a digital-to-analog conversion and an analog-to-digital conversion are accomplished in each data channel, of which there may be hundreds. It is thus a principal object of the invention to provide a new and improved data processing system. Another object of the invention is to provide a new and improved multichannel arrangement for interconverting digital and analog signals which is economical to build and which has a sampling rate not limited by the number of data channels involved.

Various other objects, advantages, and features of novelty which characterize my invention are pointed out with particularity in the claims annexed hereto and forming a part hereof. However, for a better understanding of the invention, its advantages, and objects attained by its use, reference should be made to the drawing which forms a further part hereof, and to the accompanying descriptive matter, in which there is illustrated and described a preferred embodiment of the invention.

DESCRIPTION OF THE PREFERRED EMBODIMENT

Figure 1A:
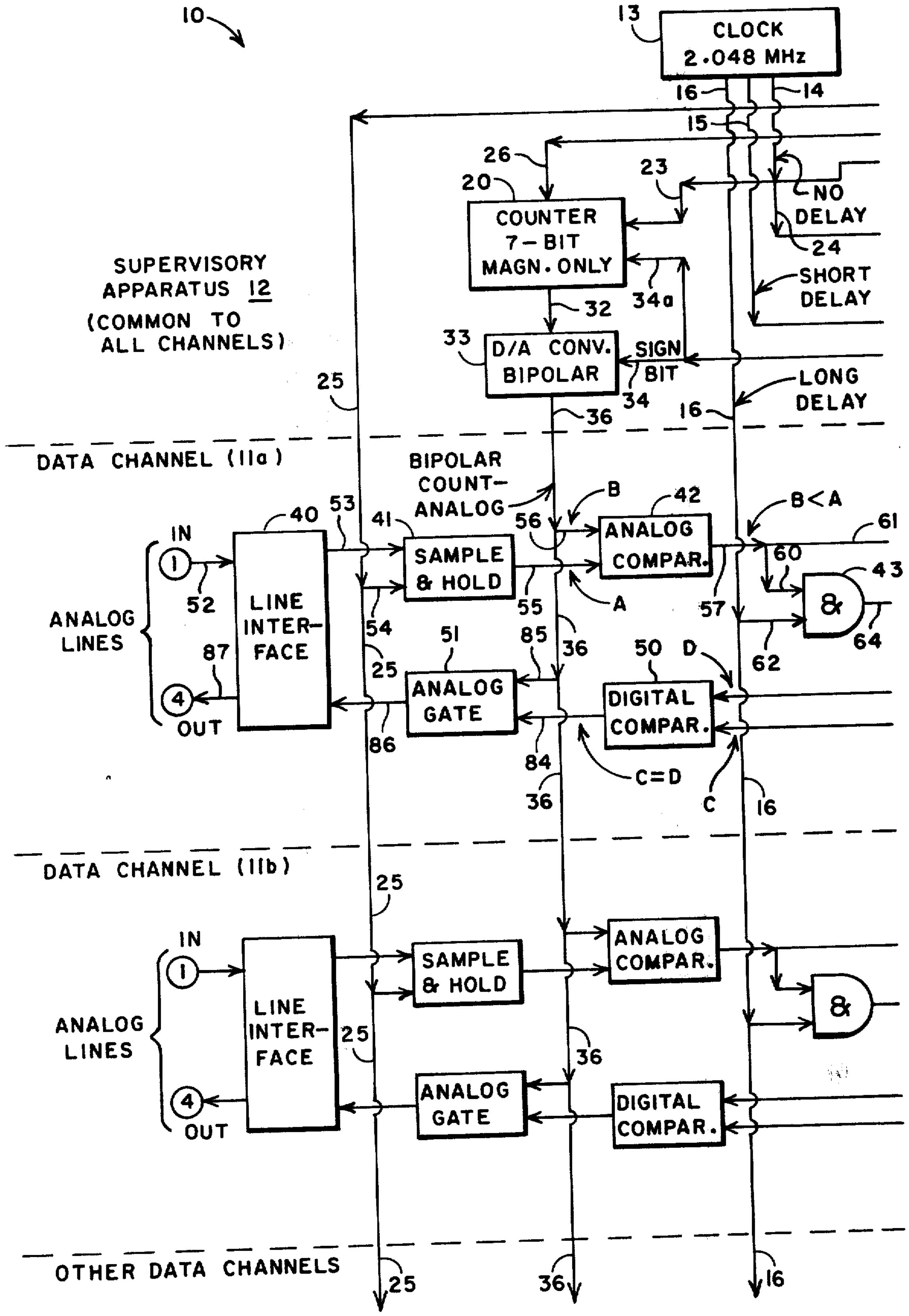
FIGS. 1*a* and 1*b* together show schematically the preferred embodiment of a bi-directional system for interconnecting digital and analog signals in a plurality of identical data channels, two such channels being explicitly depicted.
Figure 1B:
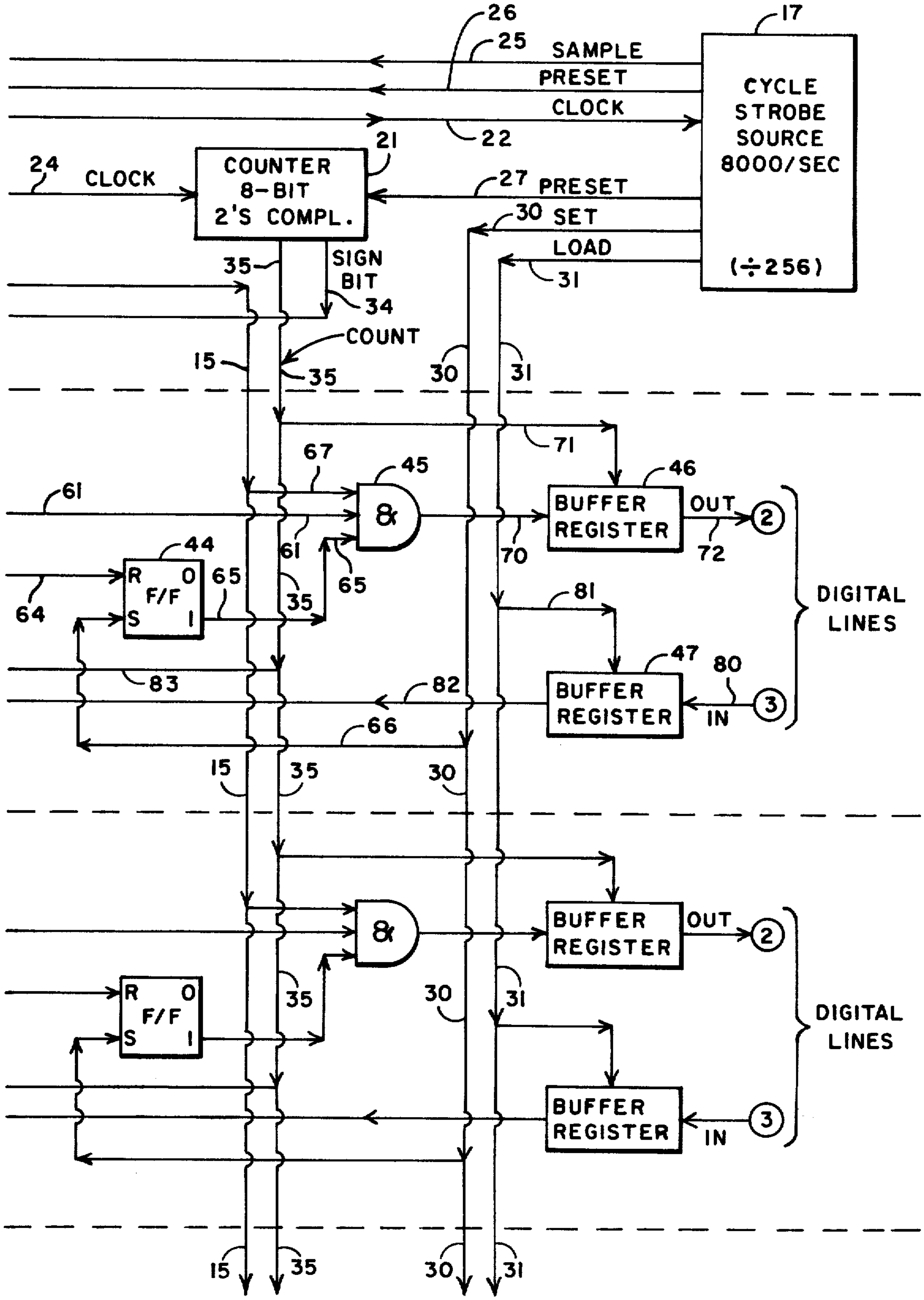

In the drawing my data processing system 10 is shown to comprise a plurality of data channels, two being identified specifically by the reference numerals 11*a* and 11*b*, and supervisory apparatus 12 arranged to supply a plurality of signals to all the channels simultaneously.

Apparatus 12 includes a clock 13 which provides a train of pulses at 14, a similar train of slightly delayed pulses at 15 and a similar train of further delayed pulses at 16.

In the example shown the frequency of clock 13 was 2.048 megahertz.

Apparatus 12 also includes a cycle strobe source 17 and a pair of counters 20 and 21, all actuated by clock output pulses 14 on conductors 22, 23, and 24 respectively. Source 17 includes a frequency divider which in this case divides the clock frequency by 256, so that the strobe repetition rate is in this example 8000 per second. At this rate source 17 supplies SAMPLE pulses at 25, PRESET pulses at 26 and 27, SET pulses at 30, and LOAD pulses at 31.

When a PRESET signal is supplied at 26, counter 20 is preset to its maximum value. This is a 7-bit binary counter which counts down one count for each clock pulse at 23 until it reaches zero: the sign bit from counter 21 then causes counter 20 to reverse its count direction and increment at each clock pulse back toward maximum. The counter output is supplied at 32 to a bipolar digital-to-analog converter 33.

When a PRESET signal is supplied at 27, counter 21 is preset to its maximum positive value. This is a 8-bit, 2's complement binary counter, the highest bit being reserved for use as a sign bit which is supplied at 34 to converter 33 to control the polarity of its output. For each clock pulse, counter 21 counts down one count until 0 is reached: additional pulses cause progressive counting through all negative values in 2's complement representation until the maximum negative state is achieved. The count from counter 21 appears in binary form at 35.

Converter 33 gives an output at 36 which is the bipolar analog of the count at 32. The signals at 15, 16, 25, 30, 31, 35, and 36 are the supervisory outputs from apparatus 12 to all the data channels, which are identical: channel 11*a* will now be described as typical.

As shown in the drawing, channel 11*a* includes analog-to-digital subchannel components including a line interface 40, a sample-and-hold circuit 41, an analog comparator 42, a two-input AND gate 43, a flip-flop 44, a three-input AND gate 45, and a buffer register 46, and digital-to-analog subchannel components including a buffer register 47, a digital comparator 50, an analog gate 51, and line interface 40.

In the analog-to-digital subchannel, interface 40 receives an analog input at 52 and transmits it at 53 to sample-and-hold circuit 41. When a SAMPLE pulse is supplied at 25, 54, circuit 41 samples the analog signal and thereafter gives an output at 55 determined thereby until the next sampling occurs. This output comprises input A to comparator 42: input B is supplied at 56 from the output 36 of converter 33. Whenever input A is greater than input B, comparator 42 supplies an output 57 which is transmitted at 60 to AND gate 43 and at 61 to AND gate 45.

A train of delayed clock pulses is supplied at 62 as a second input to AND gate 43. Whenever the gate is receiving both inputs, it supplies an output at 64 which is transmitted to flip-flop 44 and causes it to move into a "0" condition and out of a "1" condition. In this latter condition, to which the flip-flop can be moved by the SET signal supplied on conductor 66, an output is supplied at 65 to AND gate 45.

The third input to AND gate 45 is the short delay signal 15, on conductor 67. When all three inputs are present, AND gate 45 gives an output at 70 which enables register 46 to accept the count output from counter 21, which it receives on conductor 71, and in accordance with which it supplies the digital output 72 of the subchannel.

In the digital-to-analog subchannel, register 47 is connected to a digital input 80, and upon receiving a LOAD signal at 81 the register accepts the digital signal at that instant and retains it even though the signal itself changes, thus maintaining an output at 82 which comprises a first input C to digital comparator 50. A second input D to the comparator comprises the count output 35 of counter 21, supplied on conductor 83. When its inputs are equal, comparator 50 supplies an output 84 as the control input to analog gate 51, permitting the gate to receive the instantaneous count-analog signal 36, supplied on conductor 85. The gate thereafter supplies this at 86 as its output to line interface 40 until comparator 50 operates again, thus determining the line interface output 87.

Outputs 25, 26, 27, 30, and 31 of source 17 and outputs 14, 15, and 16 of clock 13 have been shown as distinct for purposes of illustration, but it will be appreciated that with channel components having suitable time constants a single signal from each source may suffice. It will also be appreciated that other values than 2.048 MHz and 8000 pulses per second may be selected according to the exigencies of required sampling rate and economical clock speed.

OPERATION OF THE PREFERRED EMBODIMENT

The operation of one channel of the system will now be described, and it should be understood that all channels operate alike in responding to the signals of the supervisory apparatus. An analog signal is present at 52 and a digital signal is present at 80. A cycle of operation starts when source 17 reaches a count which triggers its outputs. Counter 20 is preset to its maximum value, counter 21 is preset to its maximum positive value, flip-flop 44 is set to its "1" value, the analog signal is sampled and held at 41, and the digital signal is loaded into register 47. Clock 13 is operating, and at each clock pulse counters 20 and 21 count down 1: the latter counter supplies a positive sign bit to converter 33. After appropriate delays AND gates 43 and 45 are enabled for each clock pulse, and a second enable is supplied to gate 45 from flip-flop 44, but the final input is missing from each gate and neither supplies an output. As clock operation continues both the count signal on conductor 35 and the count-analog signal on conductor 36 decrease, thus decreasing input B to comparator 42 and input D to comparator 50: the other inputs to the comparators are constant at values determined by the values of the analog and digital inputs at the start of the cycle. This operation continues until either the count signal becomes equal to the digital input, or the count-analog signal becomes less than the analog input. Assume the former to occur first: comparator 50 now supplies an enable signal at 84 and gate 51 accepts and holds the instantaneous value of the count-analog signal 85 as an output to line interface 40, thus completing the digital-to-analog conversion. Operation of the clock and hence of both converters continues, and eventually the count-analog signal becomes less than the input analog signal, at which time comparator 42 supplies an enable signal to AND gates 43 and 45, the latter being also enabled from flip-flop 44. After a short delay the third input to gate 45 is supplied at 67, and buffer register 46 is enabled at 70 to receive at 71 the count on conductor 35. After a further delay, the second input to gate 43 is supplied at 62, and the gate resets flip-flop 44, which interrupts the signal at 65 to gate 45 and thus isolates register 46 from changes in the count output of counter 21. Clock operation continues until the full range of counter 21 has occurred, when a new cycle strobe output is given and the cycle is repeated with a new analog sample and a new digital load. Obviously, the two conversion operations are completely independent, and operation will be exactly as described regardless of which conversion occurs first in a given cycle.

The system as described is designed to operate where interconversion is desired between analog signals and binary signals in 2's complement representation.

It is evident that while passing from one counter state to another during counting, a false output may temporarily appear. Thus, the quantity B might instantaneously (but falsely) be less than the quantity A. Any improper operation of the appratus during this transient condition is prevented by the delay between the clock pulse causing converter operation and that enabling AND gates 43 and 45.

Numerous objects and advantages of my invention have been set forth in the foregoing description, together with details of the structure and function of the invention, and the novel features thereof are pointed out in the appended claims. The disclosure, however, is illustrative only, and changes may be made in detail, especially in matters of shape, size, and arrangement of parts, within the principle of the invention, to the full extent indicated by the broad general meaning of the terms in which the appended claims are expressed.

I claim as my invention:

1. Apparatus for interconverting analog and digital signals comprising, in combination:

a source of clock pulses;

a cycle strobe pulse source for giving a strobe pulse output after each predetermined number of clock pulses;

an n-bit, 2's complement counter giving a first count output which cyclicly passes through a range of values extending from a maximum to a minimum;

a ($n-1$)-bit, magnitude-only counter giving a second count output which cyclicly passes through a range of values extending from a maximum to a minimum;

means connecting said counters for simultaneous actuation by said clock pulses;

means for presetting said counters to maximum values in response to said strobe pulse output;

a bipolar digital-to-analog converter giving an analog output determined in magnitude by the second count output and in sign by a sign bit from said n-bit counter; and a converter channel including first and second converting means each receiving the first count and analog outputs, said first converting means for receiving an input digital signal and including means comparing the input digital signal with the first count output and giving an output signal determined by the value of the analog output at the time the first count output becomes equal to the input digital signal, said second converting means for receiving an input analog signal and including means comparing the input analog signal with the analog output and giving a digital output signal determined by the value of the first digital output at the time the analog output becomes less than the input analog signal.

2. Apparatus according to claim 1 including:

a plurality of converter channels having first and second converting means each receiving the first count and analog outputs and an input digital signal, including means comparing the input digital signal with the first count signal and giving an analog output signal determined by the value of the analog output at the time the first count signal becomes equal to the input digital signal;

and a plurality of converter channels having first and second converting means each receiving the first count and analog outputs and an input analog signal, including means comparing the input analog signal with the analog output and giving a digital output signal determined by the value of the first count output at the time the analog output becomes less than the input analog signal.

3. Apparatus according to claim 1 in which said first converting means includes:

a buffer register arranged to be set in accordance with the input digital signal;

a digital comparator connected to receive the first count output and the output of said register, and to give a further output when the inputs thereto become equal; and an analog gate connected to receive the further output and the analog output, for giving an analog output signal determined by the value of the latter at the time when said inputs to said digital comparator become equal, which does not thereafter change as the analog output continues through its cycle of values.

4. Apparatus according to claim 3 in which said buffer register is loaded with said input digital signal concurrently with resetting of said counters.

5. Apparatus according to claim 1 in which said second converting means includes:

a sample-and-hold circuit;

an analog comparator comparing the output of said sample-and-hold circuit with the analog output and operating to give a control output when the latter becomes smaller than the former;

a buffer register; and means setting said reegister in accordance with the value of the first count output at the time said analog comparator operates.

6. Apparatus according to claim 5 in which said clock pulse source also supplies delayed pulses, and in which said second converting means further includes logic means actuated by said delayed pulses for preventing said register from being set except at the time said analog comparator operates.

* * * * *